United States Patent [19]
Mizzi

[11] Patent Number: 5,245,508
[45] Date of Patent: Sep. 14, 1993

[54] CLOSE CARD COOLING METHOD

[75] Inventor: John V. Mizzi, Poughkeepsie, N.Y.

[73] Assignee: International Business Machines Corporation, Armonk, N.Y.

[21] Appl. No.: 769,750

[22] Filed: Oct. 2, 1991

Related U.S. Application Data

[63] Continuation of Ser. No. 570,441, Aug. 21, 1990, abandoned.

[51] Int. Cl.$^5$ .............................................. H05K 7/20
[52] U.S. Cl. ..................................... 361/694; 165/46; 165/80.4; 165/185; 361/699; 361/784
[58] Field of Search ................... 165/46, 80.4, 104.33, 165/185; 174/15.1, 16.3; 357/82; 361/381-386, 388, 412; 439/485, 487

[56] References Cited

U.S. PATENT DOCUMENTS

| | | | |
|---|---|---|---|
| 4,631,636 | 12/1986 | Andrews | 361/382 |
| 4,750,086 | 6/1988 | Mittal | 361/385 |
| 4,851,856 | 7/1989 | Altoz | 361/382 |
| 4,938,279 | 7/1990 | Betker | 165/46 |
| 4,958,257 | 9/1990 | Wenke | 361/385 |
| 4,963,414 | 10/1990 | Le Vasseur et al. | 361/386 |
| 4,997,032 | 3/1991 | Danielson et al. | 361/385 |
| 5,021,924 | 6/1991 | Kieda et al. | 361/384 |

FOREIGN PATENT DOCUMENTS

| | | | |
|---|---|---|---|
| 0030399 | 2/1991 | Japan | 361/386 |
| 2153990 | 8/1985 | United Kingdom | |

OTHER PUBLICATIONS

Parsapour, "Convection Cooling In Small Terminals", IBM Tech. Dis. Bulletin, vol. 24, No. 2, Jul. 1981, p. 1222.
Johnson, "Device Cooling" IBM Tech. Disc. Bulletin, vol. 20, No. 10, Mar. 1978, pp. 3919-3920.
Electronic Packing & Production 28 (1988) May No. 5, Newton, MA, USA at p. 121.

*Primary Examiner*—Gregory D. Thompson
*Attorney, Agent, or Firm*—George E. Clark

[57] ABSTRACT

The invention provides increased surface contact area for circuit board heat removal, without exposing the circuit board components to the coolant fluid. This is accomplished by compressing a heat conductive flexible membrane between adjacent circuit boards. The flexible membrane contains coolant fluid which is pumped into and out of the flexible membrane. The membrane isolates the circuit board components from the coolant fluid and is flexible enough so that it conforms to the surface of individual circuit boards. A plurality of coolant membranes are sandwiched between adjacent circuit boards and housed such that the combination of fluid pressure and circuit board to circuit board spacing maintain the conformity of the membrane to the circuit board surface. Individual circuit boards within the housing are electrically connected with edge connectors on all four sides and are separately removable from the housing. Fluid flow to coolant membranes is maintained through the edges of the membranes and between the circuit boards at the four corners of the circuit boards. This lamination of cooling membranes between circuit boards, each with their individual edge electrical connections and cooling connections, allows efficient packaging of the electrical components on the circuit boards.

12 Claims, 4 Drawing Sheets

PACKAGE FRAME 100

SIDE RAIL

CLOSE CARD COOLING METHOD

This application is a continuation of application Ser. No. 07/570,441 filed Aug. 21, 1990, now abandoned.

FIELD OF THE INVENTION

This invention relates generally to the field of housing and mounting electrical components. More particularly, this invention relates to housing closely packed integrated circuit boards for efficient cooling and interconnection.

BACKGROUND OF THE INVENTION

Integrated circuit technology enables circuit manufacturers to place increasingly large numbers of electrical devices into smaller silicon chips. Similarly, these chips are packaged and mounted on an increasingly higher density circuit board. The larger number of devices within a smaller area of circuit board has led to significant advances in circuit performance. It has also led to significant problems associated with maintaining the circuits in a low enough temperature range to enable the circuits to operate at such high performance. Typically, the circuits and circuit boards are cooled by forced air. However, efficiently removing heat from circuit boards requires a high degree of uniformity across the boards and a high heat removal rate. Forced air systems have difficulty meeting these requirements as the circuit density becomes greater. Specifically, a relatively large space between the boards is required to permit sufficient air flow between the boards. Also, two edges of the boards must be left open (i.e. free of obstructions such as interconnections) to permit the air to pass between the boards and cool the board surfaces. This decreases the interconnectivity between boards because those two sides are not available for electrical connections.

Prior art attempts to cool high density integrated circuitry have primarily focused on two areas. The first area is immersing the integrated circuits into a coolant while the circuits are in operation. The advantage of this method of cooling is that the heat transfer coefficient of the coolant can be several orders of magnitude greater than that of air. The coolant can remove greater amounts of heat and therefore more easily maintain the temperature of the circuits within a suitable range. The problem with this method of cooling is that the coolant itself can affect the electrical performance and reliability of the integrated circuit. Immersion in a coolant requires the circuit connections and the circuits to be resistant to not only the immersion in the coolant but also the corrosive effects of the coolant. Additionally, immersion in a container requires a complete shutdown of the system to service a single board in a multi-board system. This is an expensive and complicated method to cool and service the electrical system.

A second focus area in the prior art involves placing integrated circuits adjacent to heat conducting metal bodies which contain a fluid flow. The fluid flow removes the heat but does not immerse the integrated circuit in the coolant. The advantage of this system is that it avoids the reliability problems of immersing the circuits in the coolant. The problem with this method of cooling is that it is not as efficient in removing heat from the circuits as the immersion technique. The reason for this lack of cooling efficiency is that the metal body does not contact a sufficient area of the integrated circuits to rapidly transfer heat away from the integrated circuit. The lack of cooling surface area results from the complexity of producing a heat sink for an entire circuit board. That is, merely the tops of circuit modules are cooled because it is too difficult to cheaply manufacture fluid channels for the entire topology of the board. Fluid channels are also only typically used on large planar boards in order to minimize the number of fluid channel/board assemblies for packaging a given number of electronic modules. This results in long signal transmission times because signals are transmitted over a long distance on a single board rather than over a shorter distance between different boards. A three dimensional array of interconnected circuit boards shortens signal times when compared to two dimensional planar wiring.

OBJECTS

It is the object of this invention to improve the packaging density of electronic devices.

It is a further object of this invention to improve packaging density by efficiently cooling closely packed circuit boards.

It is another object of this invention to cool closely packed circuit boards uniformly.

It is still a further object of this invention to cool closely packed circuit boards without coolant fluid physically contacting circuit card components.

It is still another object of this invention to increase the interconnectivity between circuit boards.

It is still a further object of this invention to reduce signal delay times between circuits on closely packed circuit boards.

SUMMARY OF THE INVENTION

This invention provides increased surface contact area for heat removal from circuit boards without exposing the circuit board components to the coolant fluid. This is accomplished by compressing a heat conductive flexible membrane between adjacent circuit boards. The flexible membrane contains coolant fluid which is pumped into and out of the flexible membrane. The membrane isolates the circuit board components from the coolant fluid and is flexible enough so that it conforms to the surface of individual circuit boards. The coolant fluid passing through the membrane uniformly removes heat from the circuit board components because the flexibility of the membrane allows the components to act as baffles just as though the coolant was directly in contact with the circuit board. The membrane is also heat conductive so as to efficiently pass the heat from the circuit board to the fluid. The higher the thermal conductivity of the membrane material, the lower the coolant flow rate which is required for the circuit boards. Specifically, the membrane is formed of a material which has a high thermal conductivity and has a high resistance to coolant permeability.

The individual membranes are sandwiched between adjacent circuit boards and housed such that the combination of fluid pressure and circuit board to circuit board spacing maintain the conformity of the membrane to the circuit board surface. Individual circuit boards within the housing are electrically connected with edge connectors on all four sides and are separately removable from the housing. Fluid flow to coolant membranes is maintained through the edges of the membranes and between the circuit boards at the four corners of the circuit boards. This lamination of cooling membranes between circuit boards, each with their individual edge electrical connections and cooling connections, allows for efficient packaging of the circuit components on the circuit board because of the high heat removal capability. Additionally, becasue the fluid flow is constrained to the corners of the coolant membrane, all four edges of the circuit boards are available for interconnection to other circuit boards. This added interconnection flexibility further enhances the packaging density of the invention.

PREFERRED EMBODIMENT

Figure 1:
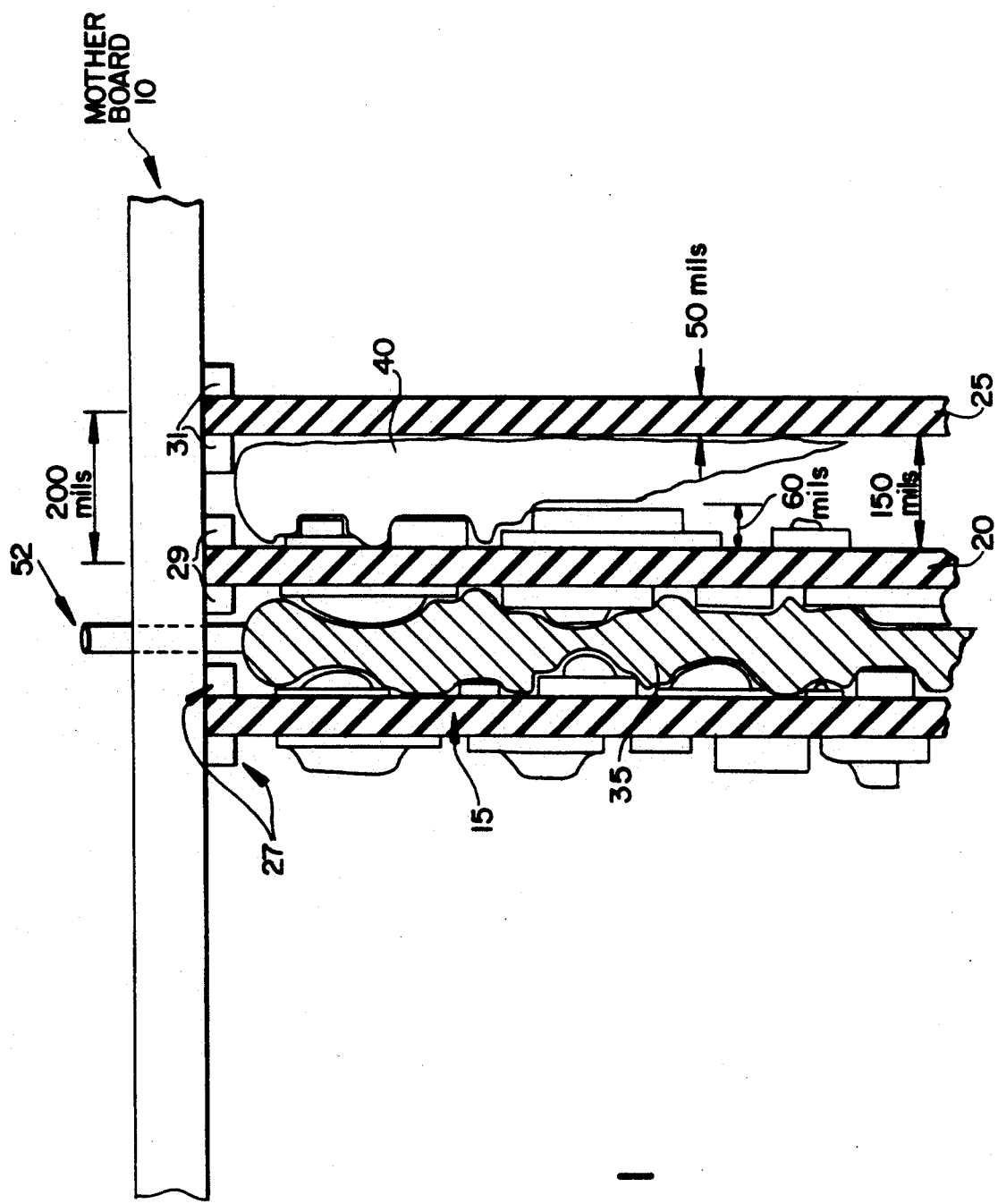
FIG. 1 illustrates a side view cross section of the present invention.

FIG. 1 illustrates a cross section of a preferred embodiment of the present invention. Top motherboard 10 contains edge connect 27, 29, and 31 which couple to the top edge of circuit boards 15, 20, and 25 respectively. Boards 15, 20, and 25 have integrated circuits mounted on one or both sides. Cooling membrane 35 is compressed between circuit boards 15 and 20. Cooling membrane 40 is compressed between circuit boards 20 and 25. Circuit boards 15, 20, and 25 have side and bottom edges which couple to side motherboards 8, and 6 (not shown) respectively, and to bottom motherboard 4 (not shown). Motherboards 4, 6, and 8 couple to the edge of circuit boards 15, 20, and 25 in the same fashion as motherboard 10.

Figure 2:
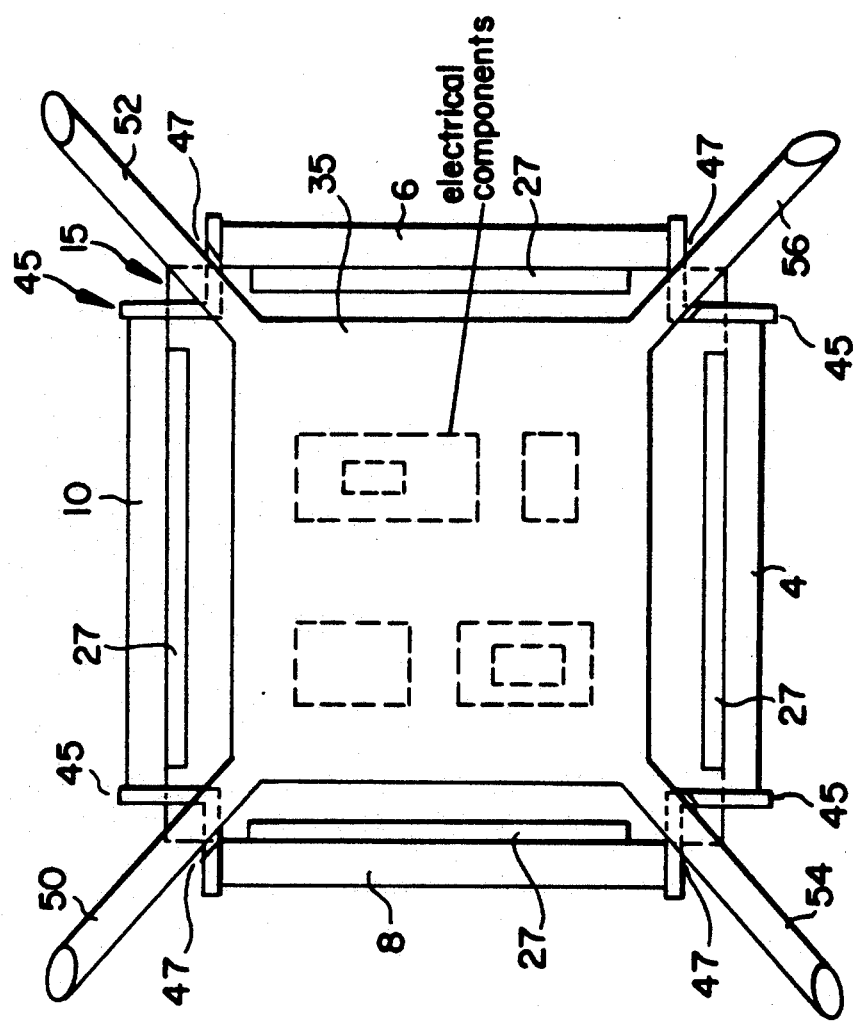
FIG. 2 illustrates a card section of the present invention.

FIG. 2 illustrates a side view of a section of the preferred embodiment of the present invention. The motherboards 4, 6, 8, and 10, hold the integrated circuit board 15 through a plurality of edge connectors 27. Edge connectors 27, 29, and 31 typically (but not necessarily) connect both sides of the circuit boards 15, 20, and 25 to the motherboards 4, 6, 8, and 10. The motherboards are mechanically connected to each other at the edges of the motherboards, through side rail members 45. The cooling membrane 35 lies against the circuit board 15. The cooling membrane 35 has four fluid nozzles, 50, 52, 54, and 56. Each nozzle fits through openings 47 in the side rail members 45. Once outside the housing formed by the motherboards 4, 6, 8, and 10 and side rail members 45, the nozzles are connected to a conventional coolant supply and pumping system (not shown). The pumping system is typically, but need not be, recirculating. Fluid nozzles 50 and 52 pump cooling fluid into the cooling membrane 35. Fluid nozzles 54 and 56 pump fluid out of the cooling membrane 35. The fluid can be a variety of fluids, including air, water, or dielectric liquids such as oils or chlorofluorocarbons. The fluid is pumped through the cooling membrane 35 and the membrane is in contact with the electrical components on the circuit board 15 so that the heat generated by the components is transmitted to the fluid and removed from the circuit board.

The electronic circuit board packing scheme shown in FIGS. 1 and 2 is very efficient in removing heat from the circuit boards. The packaging scheme allows the spacing between circuit boards to be very low. Therefore, the volumetric packing density of the electronic circuits is high when compared to air cooled systems.

The reason for this efficiency is the direct and confined forced fluid flow between circuit boards. The inlet nozzles, 50 and 52, and the outlet nozzles, 54 and 56, maintain active fluid flow between the circuit boards even though the circuit boards are closely spaced. In conventional systems, the close spacing of the circuit boards impede the direct flow of the coolant fluid (whether water, air, etc.) and so is a severe limit on the heat removal capability of the system.

The present packaging structure has a high volumetric density because the cooling fluid flow through the corners of the housing enables the circuit boards to utilize all four edges for board interconnections. Therefore, the electronic circuits can be packaged in a highly interconnected three dimensional configuration. The three dimensional interconnected structure reduces signal transmission delays caused by planar packaging used to maintain a proper temperature range for the circuits. The reduction in signal transmission delays provides a reduction in the power required to drive those signal delays and therefore, even a further increase in circuit cooling capacity.

In the present invention, the coolant membrane exerts a pressure against the circuit board surfaces. This pressure not only conforms the surface of the membrane to the circuit board surface, but also forces a fluid flow rate between the circuit boards. Increasing the inlet nozzle flow with respect to the outlet nozzle flow increases the pressure and fluid flow rate so that the heat removal rate increases. The controlled fluid flow significantly increases the heat removal efficiency of the present invention compared to prior art systems. Additionally, the coolant and the conforming membrane provide shielding to isolate the individual electrical components from stray electrical or magnetic fields emanating from adjacent or oppositely facing components.

FIG. 2 illustrates one embodiment of the present invention. The fluid flow is from top to bottom and results from four nozzles, two top inlet nozzles and two bottom outlet nozzles. The number, placement, and size of the nozzles can be varied to provide increased flow rate or circulation. There could be an inlet and outlet nozzle on the top edge of the coolant membrane and an inlet and outlet nozzle on the bottom edge of the membrane for example. Another variation on nozzle placement is to place inlets on the sides and outlets on the top and bottom edge of the membrane. Additionally, the size of the nozzles can be varied to increase or decrease fluid flow. The shape of the nozzles however should be such that the nozzle is no wider than the pressurized membrane width, to minimize circuit board to circuit board spacing, yet have maximum cross sectional area to maintain fluid flow. The nozzles illustrated in FIG. 2 are oval in shape to meet this criteria and facilitate a circuit board to circuit board pitch of 200 mils as shown in FIG. 1.

The coolant membrane 35 is formed of 2 mil thick polyether based polyurethane film. The choice of the membrane material depends on the relative importance to the system under consideration of the factors associated with the material. The polyurethane film is inexpensive, easy to heat seal, very conformable, and has high strength. Systems requiring even higher heat transfer than the polyurethane material could easily employ metal/plastic laminates as the membrane material. A laminate is a series of metal foils interposed between a series of polyurethane films. The laminate would have higher thermal conductivity but lower conformability. Other materials useful for membrane materials are parylene film, fluorohalocarbon, and plastic reinforced etched metal foil. The choice of the membrane material will also be influenced by the choice of the coolant material. Coolant membrane 35 uses water as the cooling fluid. Water does not react with the polyether based polyurethane and so is compatible with the membrane material. Other possible cooling fluids such as fluorocarbon, silicon oil, or liquid nitrogen, etc., may adversely react with the membrane material and degrade either the cooling fluid or the membrane material and therefore detract from the cooling efficiency of the system. The coolant membrane 35 may also have a metal wool type filler of highly thermally conductive material such as aluminum, copper, or stainless steel. The natural spring force of this material against the inner membrane walls will enhance the thermal conductivity of the membrane walls. Such a thermal enhancement is useful with either a polymer or metal type membrane material.

The integrated circuit boards 15, 20, and 25 are connected on a top edge to motherboard 10 via edge connections 27, 29, and 31 respectively. The edge connectors are elastomeric type high density edge connectors which are common in the art. These connectors physically allow close spacing between circuit boards. The connectors 27 are attached to motherboard 10 and interconnect circuit patterns formed on motherboard 10 to other connectors such as connectors 29 or 31. Similarly, motherboards 4, 6, and 8 also interconnect edge connectors 27, 29, and 31 with each other, with other edge connectors, and with the circuit boards. The physical dimensions of the package are reduced because air space between boards is not required for relatively inefficient air cooling. Interconnectivity is increased because circuit board edges are not used for providing air flow into and out of the space between the circuit boards. Therefore, the boards have connections on all four edges, rather than two. Increasing interconnectivity also further decreases the package dimensions. Typically, the spacing can be reduced to a 200 mil circuit board pitch with each circuit board having 60 mil high electrical components as illustrated in FIG. 1.

Figure 3:
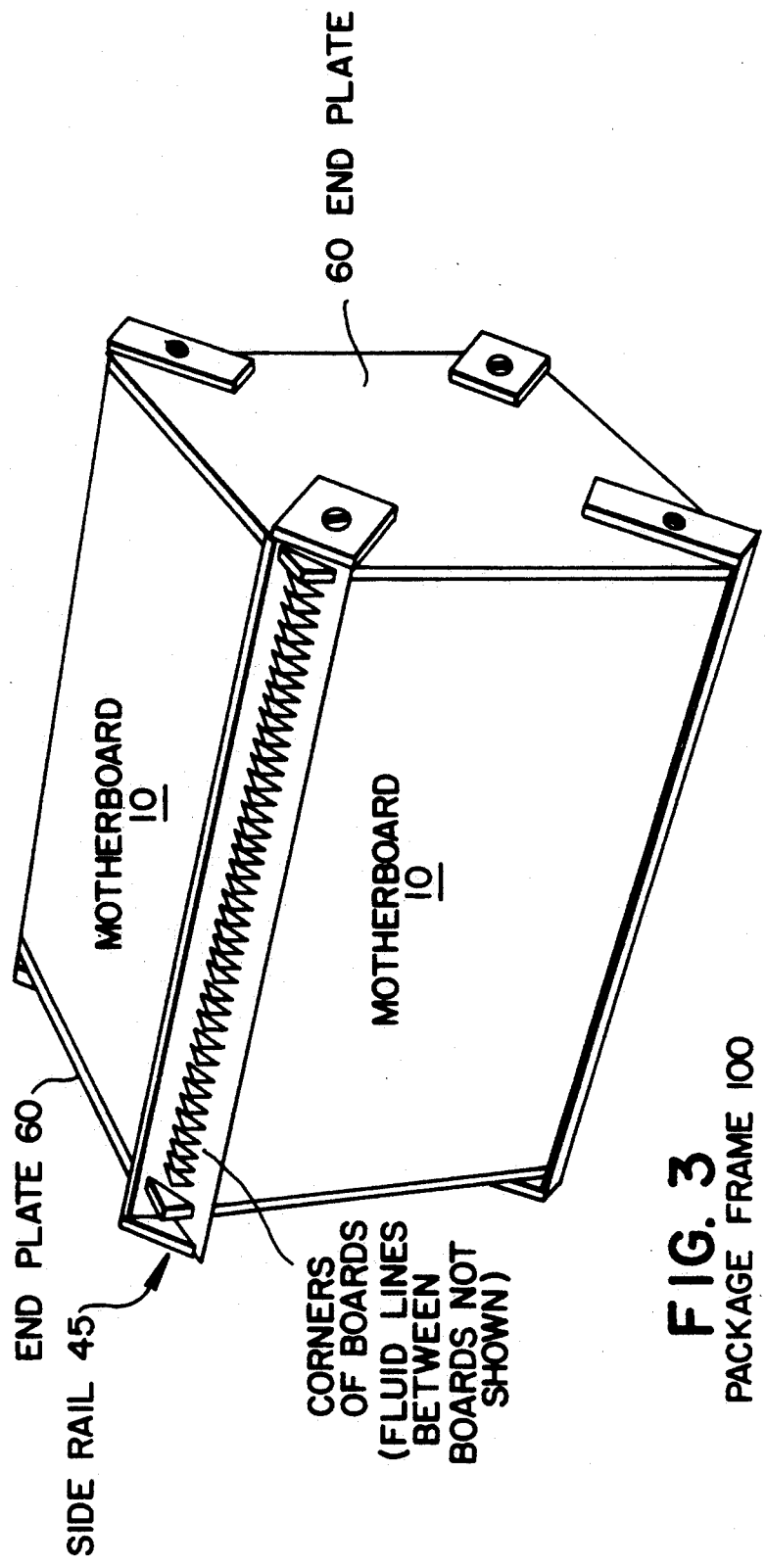
FIG. 3 illustrates a package frame of the present invention.
Figure 4:
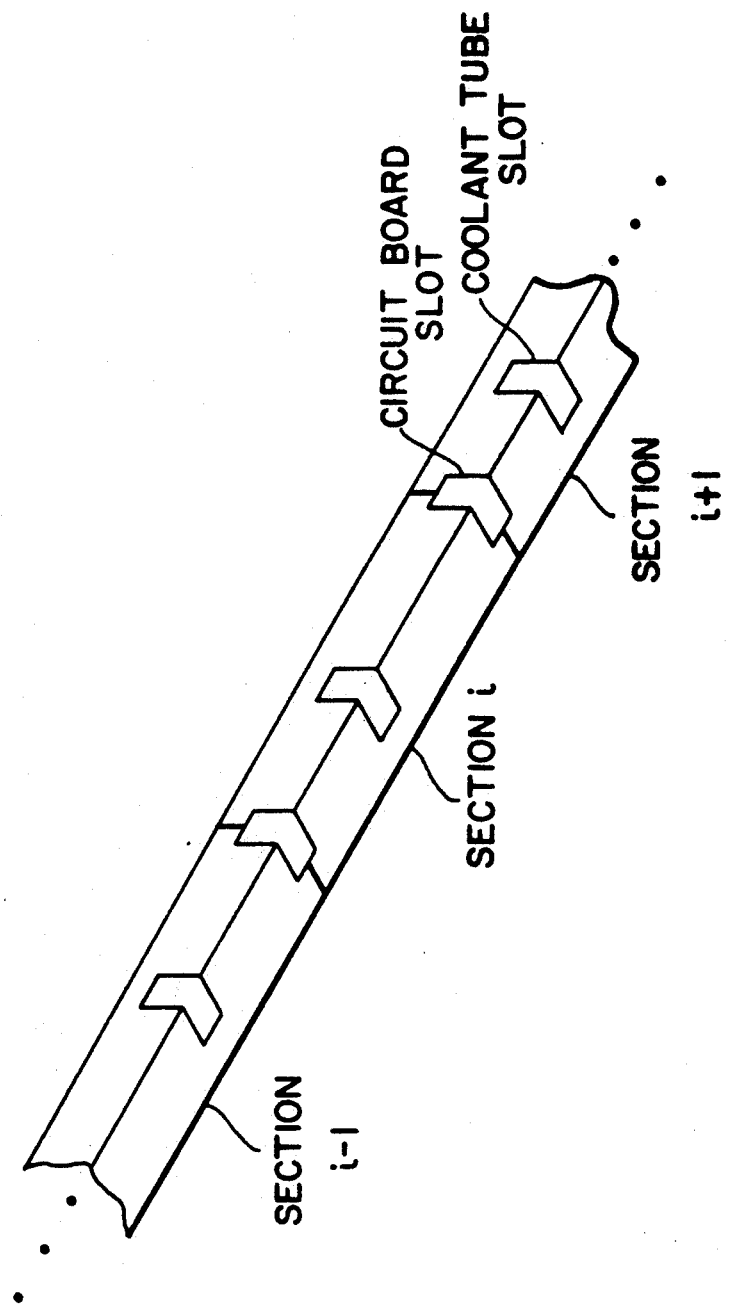
FIG. 4 illustrates a side rail of the present invention.

The circuit boards and motherboards are structurally connected by four side rails 45 and two end plates 60 to form a package frame 100 as shown in FIG. 3. The side rails 45 form a three dimensional structure by their attachment to the two end plates 60. The oppositely facing end plates 60 have their respective corners joined by the side rails 45. Each side rail 45 joins the edges of two motherboards 10 such that four motherboards 10 joined edge to edge by four side rails 45 enclose a volume. The side rails 45 have a ninety degree angle cross-section and may be made of extruded aluminum or the like. Each side rail is formed of a plurality of longitudinal sections, and each section is removably joined by a screw or other means to its two adjacent sections. This is illustrated in FIG. 4 in which sections i-1, i, and i+1 are joined end to end to form the side rail 45. This embodiment has one circuit board per section however more circuit boards per section may be used. Each connection between sections also form a slot to provide structural support for a single circuit board at a corner of the circuit board. The slots properly space the individual circuit boards and provide additional structural support for the circuit boards beyond that of the edge connectors. Each section of side rail 45 has an opening 47 for a coolant nozzle from the membrane. If more than one circuit board per section is used, more slots for coolant nozzles must also be provided in order to maintain a coolant membrane between each circuit board. In order to remove a circuit board, the side rails 45 are detached at the section for the circuit board. The integrity of the cooling system is not affected by this action because the cooling to each board is maintained by individual membranes.

While this invention has been particularly described and illustrated with references to plural embodiments thereof, it will be understood by those skilled in the art that changes in the above description or illustrations may be made with respect to form or detail without departing from the spirit or scope of the invention.

I claim:

1. A cooling system having a coolant fluid for cooling closely spaced circuit boards, comprising:
   a plurality of circuit boards, each of said plurality of circuit boards being substantially planar and having at least three edges and three corners, said plurality of circuit boards joined to a frame, said frame supporting said plurality of circuit boards, said plurality of circuit boards supported in a parallel spaced relationship, said parallel spaced relationship forming a plurality of cavities defined by adjacent circuit boards in said parallel spaced relationship;
   a plurality of coolant membranes, each of said coolant membranes having at least one inlet nozzle and one outlet nozzle for circuiting said coolant fluid through each of said plurality of coolant membranes;
   each of said plurality of coolant membranes having a single conformable surface which conforms to a surface topology of any of said plurality of circuit boards and conforms to one of said plurality of cavities;
   each cavity of said plurality of cavities having a coolant membrane from said plurality of membranes interposed within each said cavity;
   said coolant fluid pressurizes each of said plurality of coolant membranes when said coolant fluid circulates through said plurality of coolant membranes, said pressurization increases circuit board contact area with said conformable surface;
   a plurality of motherboards, at least one of said plurality of motherboards having a plurality of connections for connecting at least one edge of each of said plurality of circuit boards in said parallel spaced relationship to at least one of said plurality of motherboards; and
   said frame supporting said plurality of circuit boards and said plurality of motherboards, said frame having a plurality of side rails, said side rails support said plurality of motherboards in a substantially orthogonal relationship with respect to said plurality of circuit boards, said motherboards surround said plurality of circuit boards and form a housing around said plurality of circuit boards.

2. A cooling system having a coolant fluid for cooling closely spaced circuit boards, as in claim 1; wherein:
   at least one of said inlet or outlet nozzles has an oval shaped cross sectional area.

3. A cooling system having a coolant fluid for cooling closely spaced circuit boards, as in claim 1; wherein:
   adjacent circuit board spacing of said parallel spaced relationship is approximately 200 mils.

4. A cooling system having a coolant fluid for cooling closely spaced circuit boards, as in claim 1; wherein:
   each said coolant membrane has a surface formed of a material selected from a group consisting of polyurethane, fluorohalocarbon, or metal/plastic laminate.

5. A cooling system having a coolant fluid for cooling closely spaced circuit boards, as in claim 4, wherein:
   said coolant fluid of said coolant system is selected from a group consisting of air, water, fluorocarbon, silicon oil, or liquid nitrogen.

6. A cooling system having a coolant fluid for cooling closely spaced circuit boards, as in claim 4, wherein:
   at least one of said plurality of coolant membranes contains metal wool filler to enhance the thermal conductivity of at least one of said coolant membranes.

7. A cooling system having a coolant fluid for cooling closely spaced circuit boards, comprising:
   a plurality of circuit boards, each of said plurality of circuit boards being substantially planar and having at least three edges and three corners, said plurality of circuit boards joined to a frame, said frame supporting said plurality of circuit boards, said plurality of circuit boards supported in a parallel spaced relationship, said parallel spaced relationship forming a plurality of cavities defined by adjacent circuit boards in said parallel spaced relationship;
   a plurality of coolant membranes, each of said coolant membranes having at least one inlet nozzle and one outlet nozzle for circulating said coolant fluid through each of said plurality of coolant membranes;
   each of said plurality of coolant membranes having a single conformable surface which conforms to a surface topology of any of said plurality of circuit boards and conforms to one of said plurality of cavities;
   each cavity of said plurality of cavities having a coolant membrane from said plurality of membranes interposed within each said cavity;
   said coolant fluid pressurizes each of said plurality of coolant membranes when said coolant fluid circulates through said plurality of coolant membranes, said pressurization increases circuit board contact area with said conformable surface;
   a plurality of motherboards, at least one of said plurality of motherboards having a plurality of connections for connecting at least one edge of each of said plurality of circuit boards in said parallel spaced relationship to at least one of said plurality of motherboards;
   said frame supporting said plurality of circuit boards and said plurality of motherboards, said frame having a plurality of side rails, said side rails support said plurality of motherboards in a substantially orthogonal relationship with respect to said plurality of circuit boards, said motherboards surround said plurality of circuit boards and form a housing around said plurality of circuit boards;
   each of said side rails comprises a plurality of adjacent sections;
   each of said sections corresponds to one of said plurality of circuit boards; and
   each of said sections can be removed from a side rail to enable removal from said housing of one of said plurality of circuit boards corresponding to one of said plurality of adjacent sections.

8. A cooling system having a coolant fluid for cooling closely spaced circuit boards, as in claim 7, wherein:
   at least one of said inlet or outlet nozzles has an oval shaped cross sectional area.

9. A cooling system having a coolant fluid for cooling closely spaced circuit boards, as in claim 7, wherein:
   each adjacent circuit board spacing of said parallel spaced relationship is approximately 200 mils.

10. A cooling system having a coolant fluid for cooling closely spaced circuit boards, as in claim 7, wherein:
    each said coolant membrane has a surface formed of a material selected from a group consisting of polyurethane, fluorohalocarbon, or metal/plastic laminate.

11. A cooling system having a coolant fluid for cooling closely spaced circuit boards, as in claim 10, wherein:
    said coolant fluid of said coolant system is selected from a group consisting of air, water, fluorocarbon, silicon oil, or liquid nitrogen.

12. A cooling system having a coolant fluid for cooling closely spaced circuit boards, as in claim 10, wherein:
    at least one of said plurality of coolant membranes contains metal wood filler to enhance the thermal conductivity of at least one of said coolant membranes.

* * * * *